United States Patent [19]
Chin et al.

[11] Patent Number: 5,283,760
[45] Date of Patent: Feb. 1, 1994

[54] DATA TRANSMISSION CIRCUIT

[75] Inventors: Dae-Je Chin; Byung-Hyuk Min, both of Seoul, Rep. of Korea

[73] Assignee: SamSung Electronics Co., Ltd., Suwon, Rep. of Korea

[21] Appl. No.: 918,615

[22] Filed: Jul. 27, 1992

[30] Foreign Application Priority Data

Aug. 14, 1991 [KR] Rep. of Korea ............... 3-14098
Aug. 14, 1991 [KR] Rep. of Korea ............... 3-14099

[51] Int. Cl.$^5$ .............................................. G11C 7/00
[52] U.S. Cl. ............................... 365/189.01; 365/203
[58] Field of Search .............. 365/189.01, 230.03, 365/203

[56] References Cited

U.S. PATENT DOCUMENTS 4,757,215 7/1988 Seo ................................ 365/203
4,984,202 1/1991 Kawahara et al. ............... 365/203

OTHER PUBLICATIONS

A 23 ns 1 Mbit Biomos Dram, Yanagisawa et al., 1989 ESSCIRC, pp. 184-187.
A 1.5 v Circuit Technology for 64 Mb Drams, Nakagome et al., 1990 Symposium on VLSI Circuits, pp. 17-18.

*Primary Examiner*—Eugene R. LaRoche
*Assistant Examiner*—Andrew Tran
*Attorney, Agent, or Firm*—Robert E. Bushnell

[57] ABSTRACT

A data transmission circuit capable of a high-speed data input/output operation and a large-scaled integration for use in a semiconductor memory device, is disclosed. The data transmission circuit has at least one memory cell 51, a word line 52, a pair of bit lines 65, 66, a sense amplifier 55, and a pair of isolation transistors 53, 54. Further, the circuit includes a pair of common input-/output lines 67, 68 for transmitting input or output data with a complementary logic operation, a discharging transistor 56 receiving a control signal at its gate and having a channel connected with a ground voltage node, for transferring an electric potential applied to one end of the channel into the ground voltage level, and a pair of transmission transistors 59, 60 receiving the control signal at their respective gates and having each channel connected with the common input/output lines. Two pairs of input transistors 61, 62 and 63, 64 are connected with the bit lines, their channels each being connected between the bit lines 65, 66 and the transmission transistors 59, 60, their gates each connected with the input/output lines. A pair of output transistors 57, 58 each have a gate electrode connected to the bit lines, and having a channel connected between the channel of the discharging transistor 56 and the channel of the transmission transistors 59, 60. To control electrodes of the discharging transistor 56 and the first and second transmission transistor 59, 60 is applied a column selection line (CSL) signal.

13 Claims, 4 Drawing Sheets

DATA TRANSMISSION CIRCUIT

BACKGROUND OF THE INVENTION

1. Field of the Invention

The present invention relates to a data transmission circuit for a dynamic random access memory (DRAM) in a semiconductor memory device, and in particular to the data transmission circuit suitable for a high-speed operation as well as a high scale of integration.

2. General Description of the Prior Art

As a semiconductor memory device is getting more and more integrated and enlarged in its capacity, a requirement has been raised to achieve more high-speed input/output data transmission, as well as to carry out an error-free transmission of data. To fulfill the requirement, it is well known to those skilled in the art that a prompt and correct sensing operation in bit lines for data to be transmitted, good amplification performance of a sense amplifier for amplifying a potential difference on the bit lines, and an effective layout of every memory element, should be well balanced together.

One of prior art data transmission circuits is disclosed in FIG. 1, while its operational timing diagram is shown in FIG. 2. The prior art data transmission circuit includes memory cells 9, 10, word lines 11, 12, bit lines (BL/$\overline{BL}$) 15, 16, a sense amplifier 7 coupled to the bit lines, isolation transistors 1 to 4 for isolating of the memory cells, input/output transistors 5, 6 coupled to the bit lines, input/output lines 13, 14 coupled to the input/output transistors, and a sense amplifier 8 coupled to the input/output lines. To each control gate of the input/output transistors 5, 6 is connected a column select line (CSL).

During a read operation of data stored in a memory cell 9, the isolation transistors 1, 2, coupled to the same memory cell are all turned on, while the other isolation transistors 3, 4 are turned off. At the moment, a word line 11 of the memory cell is selected to transmit the data onto the bit line BL, and a potential difference between the bit lines BL and $\overline{BL}$ is then amplified by the sense amplifier 7. The data transmitted onto the bit lines 15, 16 are further transmitted to the input/output lines 13, 14 through each input/output transistor 5, 6 by selection of the column select line. The electric potential of the data that has gone down due to parasitic capacitance on the input/output lines, is then increased again by the input/output sense amplifier 8. The characteristic of this data transmission circuit may be that the bit lines 15, 16 and the input/output lines 13, 14 are both arranged to be coupled with each drain and source area of the input/output transistors 5, 6. Therefore, the column select line (CSL) has to be selected subsequent to enough increase of the potential difference in the bit lines, thus leading to decrease of its operation speed due to existence of a delay time, wherein as seen in FIG. 2, about one volt of enables a logic high state. The electric potential of the data transmitted onto the input/output lines has a voltage drop by each threshold voltage of the input/output transistors 5, 6. Further, when the input/output transistors are turned on, the input/output lines 13, 14 and the bit lines 15, 16 are connected to each other so as to increase the parasitic capacitance. Hence, the potential difference in each data transmitted onto the input/output lines is further decreased so that the sensing capability of the input/output sensing amplifier 8 is considerably deteriorated.

Other example of prior art data transmission circuits, trying to resolve such a drawback in the circuit of FIG. 1, is disclosed in FIG. 3, which is known from a technical paper relating to 64 Mega DRAM device of "1990 Symposium of VLSI Circuit" by a Japanese company Hitachi. This circuit includes memory cells 33, 34, isolation transistors 21 to 24, bit lines 39, 40 and sense amplifiers 32, 41 similar to those in the FIG. 1 circuit. However, one of the most important differences between FIG. 1 and FIG. 3, may be that the bit lines 39, 40 are respectively coupled to each gate of output transistors 25, 26. Thus, there are provided not only a pair of data input lines 35, 36 and a pair of data output lines 37, 38, but also a pair of input transistors 29, 31 and a pair of output transistors 25, 26, each further connected to the bit lines, or the input/output lines. The circuit further includes a pair of transmission transistors 28, 30 connecting the input lines 35, 36 to the input transistors 29, 31, and a discharge transistor 27 coupling either one end of the output lines 37, 38 to a reference potential, for example, a ground.

Referring to FIG. 3, in case of reading out data stored in a memory cell 33, the data is amplified by the sense amplifier 32 through the isolation transistor 21. At this moment, once the column select line (CSL) is selected, the discharge transistor 27 is turned on to thereby turn on the output transistors 25, 26. Thus the sense amplifier 41 is enabled to operate. Then a difference of current drive in between the output transistors 25, 26 depending on the potential difference of the data in the bit lines 39, 40 causes different data to be transmitted onto the output lines 37, 38, finally passing through the output sense amplifier 41. In the meanwhile, in case of writing data into the memory cell 33, once the data is transmitted onto the data input lines 35, 36, the input transistors 29, 31 are turned on. Then, once the column select line (CSL) is selected, the transmission transistors 28, 30 connected to the data input lines 35, 36 are also turned on, so that the data transmission is carried out by connecting the input lines with the bit lines 39, 40.

This data transmission circuit as aforementioned, has improved data transmission speed as compared to that of FIG. 1, since its bit lines 39, 40 are directly connected to each gate of the output transistor. However, during a write operation, an electric potential of data is often subject to a voltage drop by a total sum of threshold voltages in the input transistors and the transmission transistors, thereby resulting in insufficient amplification of the potential difference. Further, the respective input and output lines are necessary and too many transistors are to be employed in connection with data input/output operation, which serves as an undesirable drawback for high-scale integration of semiconductor memory devices.

SUMMARY OF THE INVENTION

It is, therefore, an object of the present invention to provide a data transmission circuit capable of a high-speed data input/output operation and a large-scaled integration in a semiconductor memory device, thereby overcoming the aforementioned drawbacks.

According to one aspect of the present invention, the data transmission circuit is provided with at least one memory cell, a pair of bit lines respectively connected to the memory cell, a sense amplifier for amplifying an electric potential difference in between the bit lines, and a pair of isolation transistors. Further, the circuit includes a pair of common input/output lines for transmitting input or output data with a complementary logic operation, a discharging transistor receiving the control signal at its gate and having a channel connected with a ground voltage node, for transferring an electric potential applied to one end of the channel into the ground voltage level, a pair of transmission transistors receiving the control signal at their respective gates and having each channel connected with the common input/output lines, two pairs of input transistors connected with the bit lines, each channel of the input transistors being connected between either one of the bit lines and either one of the transmission transistors, each gate electrode of the input transistors receiving an electric potential on one of the input/output lines, and a pair of output transistors each having a gate electrode connected to one of the bit lines, and having a channel connected between one end of the channel of the discharging transistor and one end of the channel of the transmission transistors.

According to another aspect of the invention, the data transmission circuit includes at lease one memory cell, a pair of bit lines connectable to each memory cell, isolation transistors for isolating each memory cell from the other components, a sense amplifier and a word line. Further, the circuit includes a pair of input/output lines for data transmission to and from an outside of a memory device, a grounding transistor receiving as a control gate voltage a given column select line (CSL) signal and having a channel connectable to a ground voltage node, for making an electric potential applied to one end of the channel into a ground voltage level, a first input transistor having a channel connected between the bit line and the common input/output line, and a gate electrode connected to the column select line signal, a second input transistor having a channel connected between the bit line and the common input/output line, and a gate electrode connected to the column select line signal, a first output transistor having a gate connected to the bit line, and a channel connected between one channel of the grounding transistor and the common input/output line, and a second output transistor having a gate connected to the bit line, and a channel connected between the channel of the grounding transistor and the common input/output line.

BRIEF DESCRIPTION OF THE DRAWINGS

A more complete appreciation of the invention, and many of the attendant advantages thereof, will be readily enjoyed as the same becomes better understood by reference to the following detailed description when considered in conjunction with the accompanying drawings in which like members indicate the same or similar components, wherein.

DETAILED DESCRIPTION OF THE INVENTION

Figure 1:
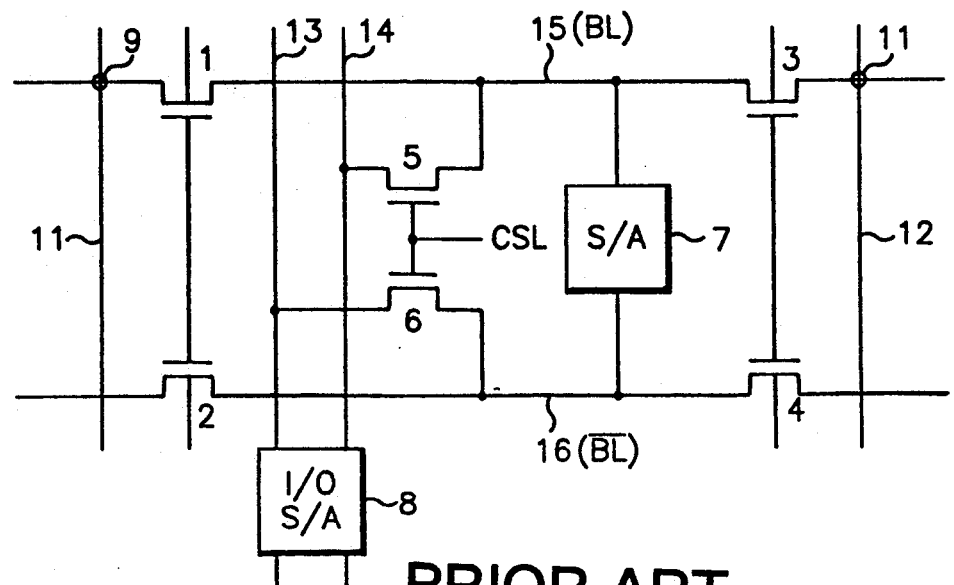
FIG. 1 shows a schematic circuit diagram of one of prior art data transmission circuits.
Figure 2:
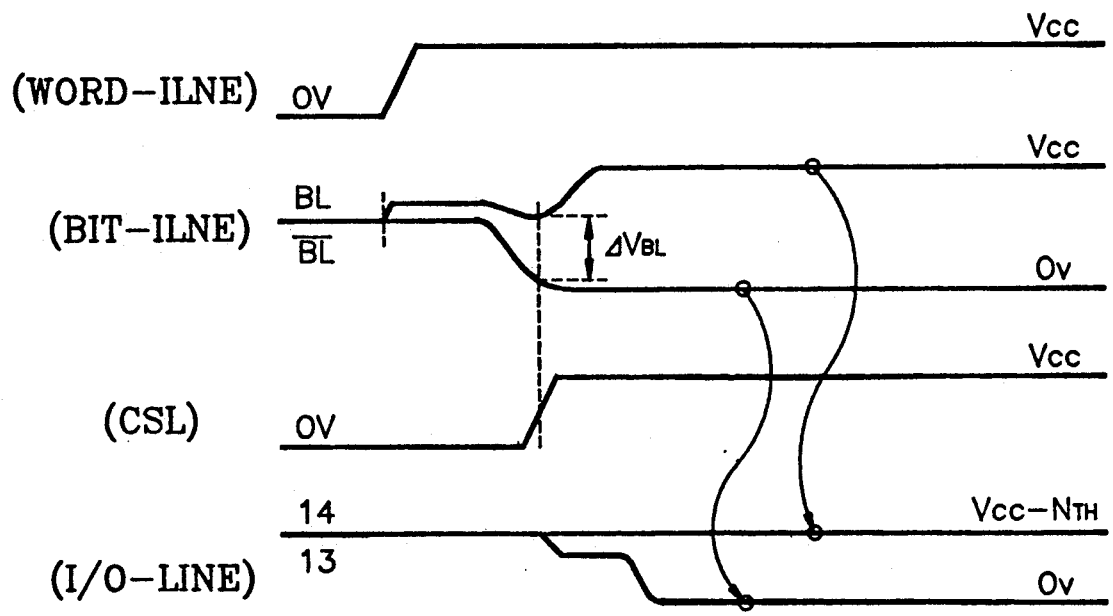
FIG. 2 shows a timing diagram during a read operation in the circuit of FIG. 1.
Figure 3:
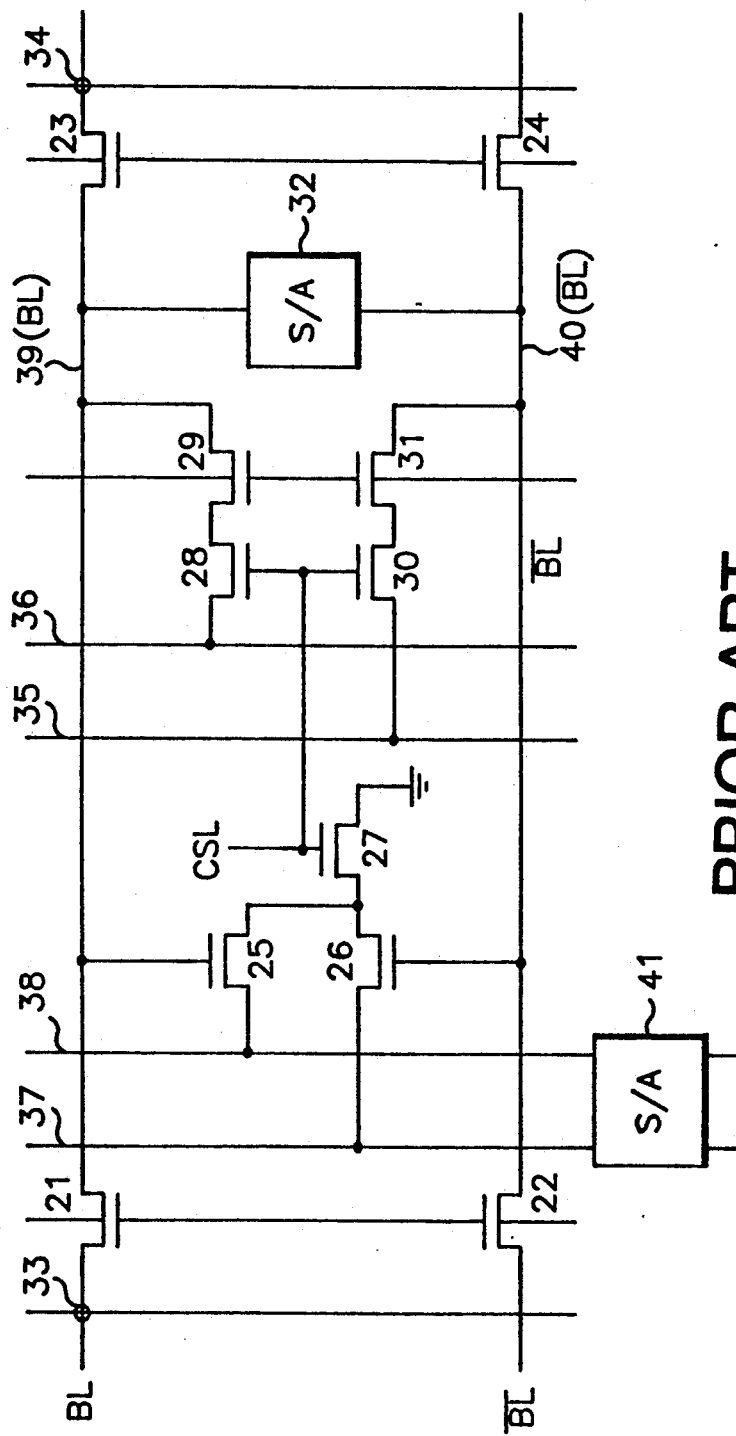
FIG. 3 shows a schematic circuit diagram of other prior art data transmission circuit.
Figure 4:
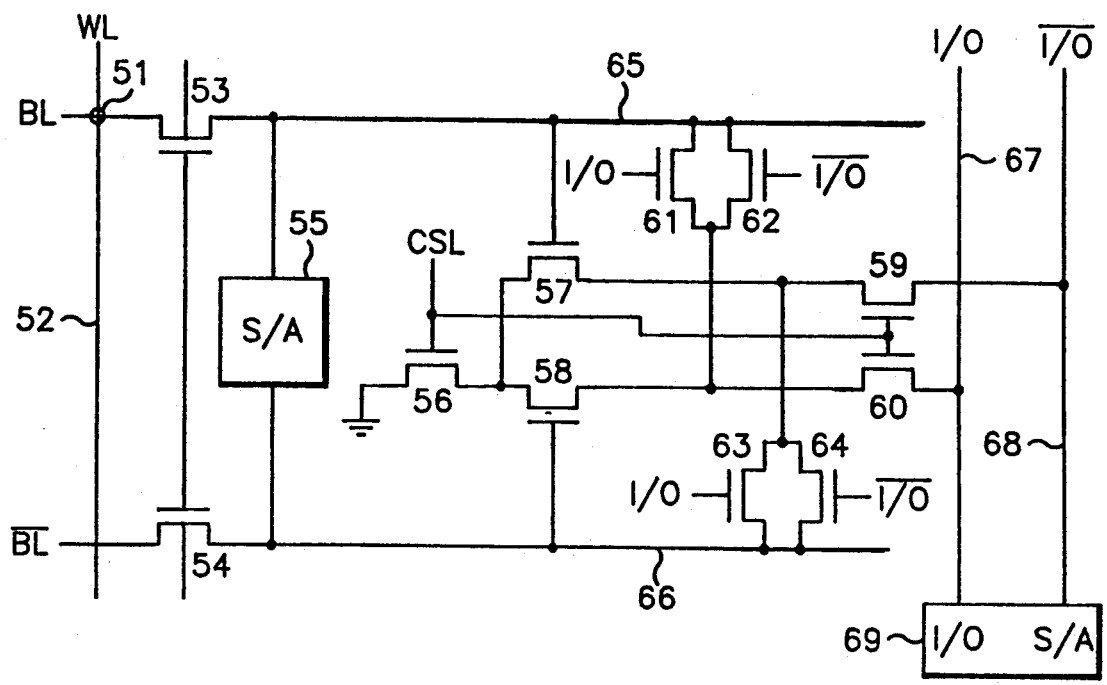
FIG. 4 shows a schematic circuit diagram of a preferred embodiment of a data transmission circuit according to the present invention.

Referring to FIG. 4, a data transmission circuit according to the present invention is disclosed, wherein a pair of complementary data input/output lines (I/O and $\overline{I/O}$ 67, 68 are provided, a pair of bit lines (BL and $\overline{BL}$) 65, 66 are respectively coupled to each gate electrode of first and second output transistors 57, 58, and a first pair of input transistors 61, 62, and a second pair of input transistors 63, 64 are respectively coupled to either one of the complementary input/output lines 67, 68 at their gates. Further, a drain (or source) of the first output transistor 57 is connected to a drain (or source) of the second pair of input transistors 63, 64, while the second output transistor 58 is likewise connected to the first pair of input transistors 61, 62.

Figure 6:
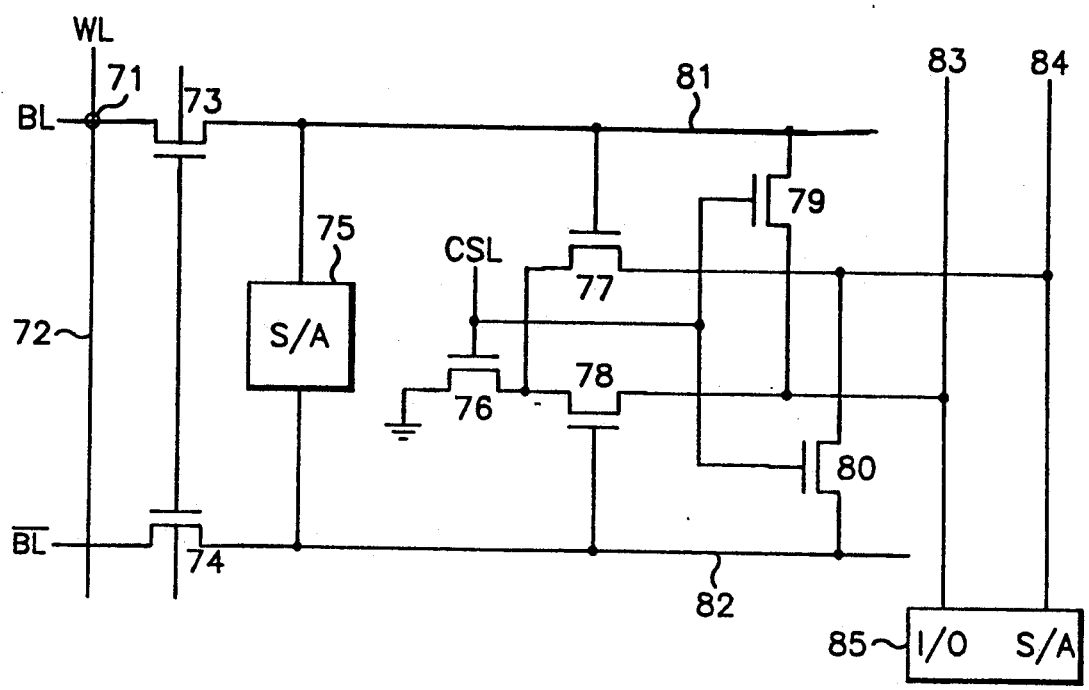
FIG. 6 shows another embodiment of a data transmission circuit according to the present invention.

Referring further to FIG. 6, a pair of data input/output lines 83, 84 with complementary logic are provided, and a pair of bit lines (BL, $\overline{BL}$) 81, 82 each are connected to a respective gate of first and second output transistors 77, 78. Further the first output transistor 77 and a first input transistor 79 are coupled to the input-/output line 84, while the second output transistor 78 and a second input transistor 80 are coupled to the other input/output line 83. Here, it should be noted that a pair of common input/output lines as a data input/output path are employed to decrease a number of transistors in use.

Figure 5:
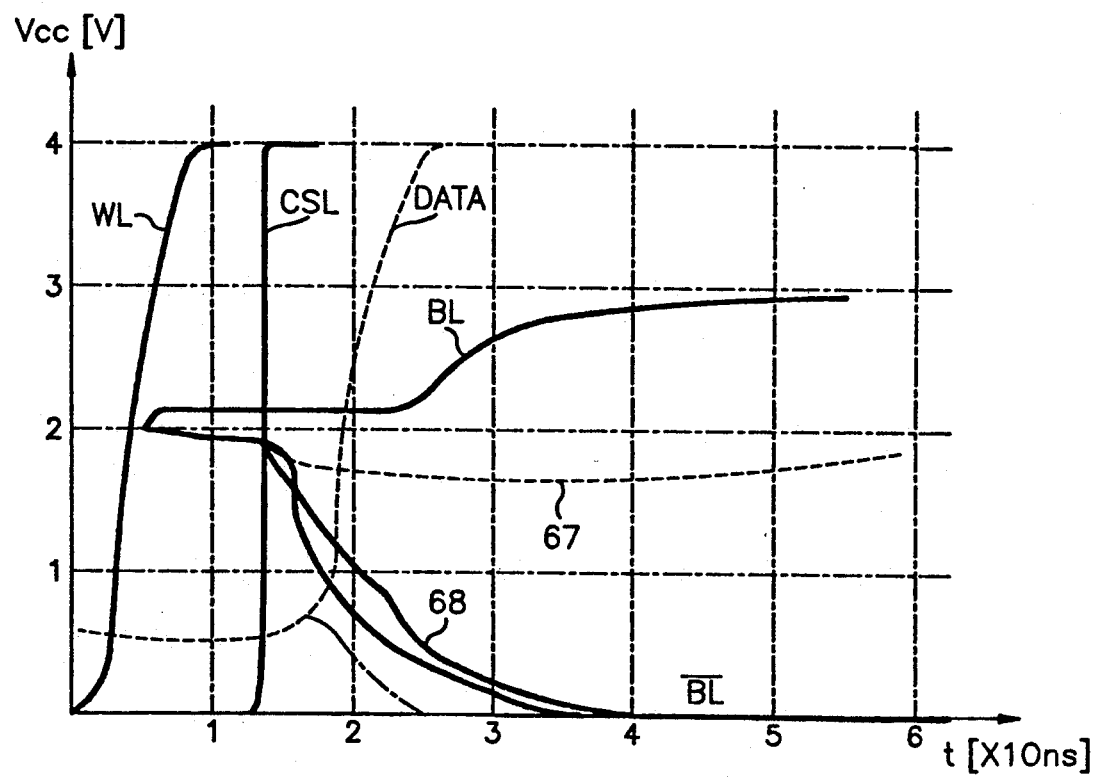
FIG. 5 shows an output characteristic curve in the circuit of FIG. 4.

Referring again to FIG. 4, the data transmission circuit is provided with at least one memory cell 51, a pair of bit lines 65, 66 respectively connected to the memory cell, a sense amplifier 55 for amplifying an electric potential difference in between the bit lines, and a pair of isolation transistors 53, 54. Further, the circuit includes a pair of common input/output lines 67, 68 for transmitting input or output data with a complementary logic operation, a discharging transistor 56 receiving the control signal at its gate and having a channel connected with a ground voltage node, for transferring an electric potential applied to one end of the channel into the ground voltage level, a pair of transmission transistors 59, 60 receiving the control signal at their respective gates and having each channel connected with the common input/output lines, two pairs of input transistors 61, 62 and 63, 64 connected with the bit lines, each channel of the input transistors being connected between either one of the bit lines and either one of the transmission transistors 59, 60, each gate electrode of the input transistors receiving an electric potential on one of the input/output lines, and a pair of output transistors 57, 58 each having a gate electrode connected to one of the bit lines, and having a channel connected between one end of the channel of the discharging transistor and one end of the channel of the transmission transistors. In this embodiment circuit, all the transistors may be constructed with NMOS type transistors. To control electrodes of the discharging transistor 56 and the first and second transmission transistor 59, 60 is applied a column selection line (CSL) signal. This CSL signal goes to logic high once a word line 52 has been designated, as seen in FIG. 5, and a memory cell 51 has been selected. The isolation transistor 53, 54 serve to isolate the electrical connection between memory cells of any memory cell arrays. The sense amplifier 55 may have any construction known in this field.

The operation of the circuit shown in FIG. 4 will be explained in detail in the following. The first and second output transistors 57, 58 have a complementary turn-on operation upon inputing and outputing of data, and serve as a switching transistor for controlling a current amplification in the input/output lines 67, 68. For example, when the second output transistor 58 turns off, one input/output line 67 connected with a channel of the second output transistor is electrically disconnected from a ground voltage node, thereby achieving a high-speed current amplification operation.

To being with a data read operation in a memory cell, once a word line 52 is selected, one bit line 65 goes logically higher than the other bit line 66, due to a charge sharing of the memory cell 51 with the bit line 65. Then, when the column selection line (CSL) is selected, the first output transistor 57 turns on earlier than the second output transistor 58. Thus the input/output line 68 coupled to the channel of the first output transistor 57 begins to discharge through the discharging transistor 56 toward the ground voltage level, so as to have the sense amplifier operate to drive the bit line 65 to a logic high level and the bit line 66 to a logic low level. Hence, current flow through the first output transistor 57 further increases, while the second output transistor 58 gradually turns off, thereby making larger the potential difference between both input/output lines. At this time, the first pair of input transistors 61, 62 turn off to prevent electrical communication in between the bit line 65 and the input/output line 67 and to continuously maintain an electric potential of the bit line 65. Thus, as seen by the output characteristic of FIG. 5, a sensing operation of the bit lines 65, 66 as well as an amplification operation of the input/output lines 67, 68 will be performed more rapidly, so that a high-speed data output can be achieved.

Then, a data write operation into the memory cell 51 will be described. Data on the input/output lines 67, 68 is delivered to the bit lines 65, 66 through the first and second pairs of input transistors 61, 62 and 63, 64. For example, assuming that any data exists on the input/output line 67, an electric potential of the bit line 65 increases to logic high to thereby turn on the first output transistor 57. Then, the electric potential of the input/output line 68 flows down to the ground voltage node to thereby turn off the second output transistor 58. Therefore, the electric potential of the input/output line 67 is applied only to the bit line 65 so as to achieve a write operation into the memory cell 51. This embodiment circuit as set forth in FIG. 4 would be preferable for large-scale integration and high-speed data transmission of a semiconductor memory device.

Referring again to FIG. 6, showing another embodiment of a data transmission circuit according to the present invention, the data transmission circuit includes at lease one memory cell 71, a pair of bit lines 81, 82 connectable to each memory cell, isolation transistors 73, 74 for isolating each memory cell from the other components, a sense amplifier 75 and a word line 72. Further, the circuit includes a pair of input/output lines 83, 84 for data transmission to and from an outside of a memory device, a grounding transistor 76 receiving as a control gate voltage a given column select line (CSL) signal and having a channel connectable to a ground voltage node, for making an electric potential applied to one end of the channel into a ground voltage level, a first input transistor 79 having a channel connected between the bit line 81 and the common input/output line 83, and a gate electrode connected to the column select line signal, a second input transistor 80 having a channel connected between the bit line 82 and the common input/output line 84, and a gate electrode connected to the column select line signal, a first output transistor 77 having a gate connected to the bit line 81, and a channel connected between one of the grounding transistor 76 and the common input/output line 84, and a second output transistor 78 having a gate connected to the bit line 82, and a channel connected between the channel of the grounding transistor 76 and the common input/output line 83. The sense amplifiers 75, 85 may have any known construction in the art.

The operation of the data transmission circuit shown in FIG. 6 will be described hereinafter. A threshold voltage of the first and second input transistors 79, 80 would be made higher than that of the first and second output transistors 77, 78, by using, for example, an ion-implantation. The reason why doing this is that when amplifying data of the bit lines 81, 82 through the first and second output transistors 77, 78 to the input/output lines 83, 84, the first and second input transistors 79, 80 and the input/output lines 83, 84 should be electrically disconnected to each other. It would be well appreciated to an expert skilled in the art that good amplification operation in the input/output lines 83, 84 could not be effected if the input transistors 79, 80 and the input/output lines are connected to each other.

Figure 7:
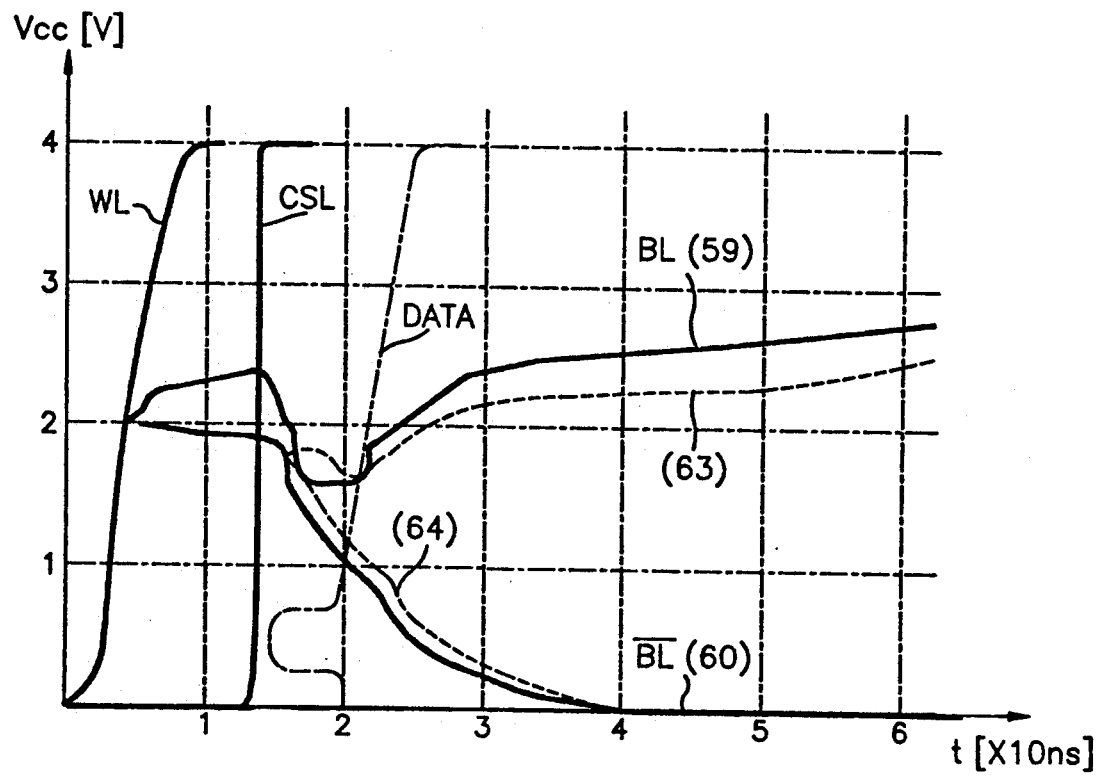
FIG. 7 shows an output characteristic curve in the circuit of FIG. 6.

To begin with a data read operation in a memory cell 71, once the bit line 81 goes "high" and the other bit line 82 goes "low", a column selection line (CSL) is selected (that is, it goes "high"). Then, the first output transistor 77 turns on and the second output transistor 78 turns off. Thus, as a potential difference occurs in between the input/output lines 83, 84 coupled to channels of the first and second output transistors 77, 78, the first and second output transistors function as a current amplifier to deliver data to the input/output lines 83, 84. Here, the first and second input transistors 79, 80 have higher threshold voltage than that of the first and second output transistors 77, 78, so they turn off till a potential difference occurs in the input/output lines 83, 84. Thus it is prevented that the bit lines 81, 82 are electrically connected to the input/output lines 83, 84 through the first and second input transistors 79, 80. If these first and second input transistors 79, 80 turn on, then the electric potential of the input/output line 84 with a ground voltage level drives the second output transistor 78 to turn off through the second input transistor 80, thereby preventing current flowing from the input/output line 83 to the ground voltage node and achieving more prompt amplification. As seen in FIG. 7, it would be noted that this prompt amplification in the input/output lines 83, 84 as well as the sensing operation in the bit lines 81, 82 leads to a high-speed data input/output operation.

Next, in a data write operation into the memory cell 71, data on the input/output lines 83, 84 is delivered to the bit lines 81, 82 through the first and second input transistors 79, 80. At this time, as seen in the previous read operation, a logic low voltage of the input/output line 84 turns off the second output transistor 78 through the second input transistor 80 connected with the input/output line, and the input/output line 83 with logic high data is not only electrically disconnected from the ground voltage node, but also connected to the memory cell 71 through the first input transistor 79 and the bit line 81. Accordingly, it will be understood that a complete write operation is achieved.

Such data transmission circuits as set forth in the diagrams of FIGS. 4 and 6 show only preferred embodiments of the present invention and do not intend to limit the scope of the invention. For example, threshold voltages of the input transistor 61-64, 79 and 80 may be controlled to a desired level by using a conventional method such as ion-implantation, and each component in the circuits of FIGS. 4 and 6 may be substituted by other equivalent or similar components without departing from the spirit of the present invention, which may be known to an expert skilled in the art.

As apparent from the foregoing description, the data transmission circuit according to the invention achieves high-speed data transmission upon transmitting data from a bit line to a data input/output line, owing to such direct connection of the bit line to a gate of an output transistor. Furthermore, it helps to solve a drawback in the prior art data transmission circuit with separate input line and output line, by decreasing a number of components owing to a common data input/output line.

While the foregoing provides a full and complete disclosure of the preferred embodiments of the present invention, various modifications, alternate constructions and equivalents thereof may be employed without departing from the true spirit and scope of o the invention. Therefore, the above description and illustration should not be construed as limiting the scope of the invention, which is defined by the appended claims.

What is claimed is:

1. A data transmission circuit for use in a semiconductor memory device for writing and reading data into and out of a memory cell in accordance with a control signal, provided with a plurality of memory cells, a pair of bit line respectively connected to the memory cell, and a sense amplifier for amplifying an electric potential difference in between the bit lines, the circuit comprising:

common input/output line means having a pair of input/output lines for transmitting input or output data with a complementary logic operation;

a discharging transistor receiving the control signal at its gate and having a channel connected with a ground voltage node, for transferring an electric potential applied to one end of the channel into the ground voltage level;

a transmission transistor means having a pair of transistors receiving the control signal at their respective gates and having each channel connected with the common input/output lines;

input transistor means including two pairs of input transistors connected with the bit lines, each channel of the input transistors being connected between one of the bit lines and one of the input/output lines, each gate electrode of the input transistors receiving an electric potential on one of the input/output lines; and output transistor means including a pair of transistors each having a gate electrode connected to one of the bit lines, and having a channel connected between one end of the channel of the discharging transistor and one end of the channel of the transmission transistors.

2. The data transmission circuit as set forth in claim 1, wherein said control signal corresponds to a column select line (CSL) signal that is adapted to be assigned just following selection of a word line in the memory cell.

3. The data transmission circuit as set forth in claim 1, wherein said transmission transistor means includes first and second transistors each having a channel connected to either one of the input/output lines and a gate electrode receiving said control signal.

4. The data transmission circuit as set forth in claim 3, wherein said input transistor means includes first and second transistor pairs, said each pair including two NMOS transistors each having a gate connected to either one of the common input/output lines, and having a channel connected between either one of the bit lines and a drain or source electrode of the transmission transistor.

5. The data transmission circuit as set forth in claim 4, wherein said NMOS transistors of said first and second transistor pairs are adapted to turn on only during a data input timing sequence.

6. The data transmission circuit as set forth in claim 3, wherein said output transistor means includes a first output transistor having a gate connected to one of the bit lines and a channel connected between the discharging transistor and the first transistor of said transmission transistor means, and a second output transistor having a gate connected to the other one of the bit lines and a channel connected between the discharging transistor and the second transistor of said transmission transistor means.

7. The data transmission circuit as set forth in claim 6, wherein said first and second output transistors are adapted to turn on in a complementary manner during data input and output operation.

8. The data transmission circuit as set forth in claim 6, wherein when either one of the first and second output transistors is turned off, a corresponding one of the common input/output lines coupled to a channel of the turned-off output transistor is electrically isolated from the ground voltage node.

9. A data transmission circuit for use in a semiconductor memory device having a plurality of memory cells, a pair of bit line connectable to the memory cell, a sense amplifier for amplifying a potential difference between the bit lines, and a pair of common input/output lines with a complementary logic level for data transmission, an input/output operation of the data being controlled by a column selection line (CSL) signal, said circuit comprising:

a first switching transistor having a control gate coupled to one of the bit lines, and a channel connected between a ground voltage node and one of the common input/output lines;

a second switching transistor having a control gate coupled to the other one of the bit lines, and a channel connected between the ground voltage node and the other one of the common input/output lines;

a first pair of input transistors each having a control gate connected to the pair of common input/output lines, and a channel connected between one of the bit lines and either one channel of the first and second switching transistors, for carrying out a data input transmission therethrough; and a second pair of input transistors each having a control gate connected to the pair of common input/output lines, and a channel connected between the other one of the bit lines and either one channel of the first and second switching transistors, for carrying out a data input transmission therethrough.

10. The data transmission circuit as set forth in claim 9, wherein the first and second switching transistors are adapted to turn on in a complementary manner during data inputing and outputing sequence.

11. The data transmission circuit as set forth in claim 9, wherein the first and second pairs of input transistors are respectively turned on only during data inputing sequence.

12. The data transmission circuit as set forth in claim 9, wherein when the first switching transistor or the second switching transistor is turned off, a corresponding one of the common input/output lines coupled to a channel of the first or second switching transistor is electrically isolated from the ground voltage node.

13. The data transmission circuit as set forth in claim 9, further comprising a pair of transmission transistors connected between the respective channel of the first and second switching transistors and either one of the common input/output lines and having each control gate receiving the column selection line signal, and comprising a discharging transistor having a channel connected between the channel of the first and second switching transistors and the ground voltage node.

* * * * *

UNITED STATES PATENT AND TRADEMARK OFFICE
CERTIFICATE OF CORRECTION

PATENT NO. : 5,283,760
DATED : February 1, 1994
INVENTOR(S) :
    Dae-Je Chin and Byung-Hyuk Min It is certified that error appears in the above-indentified patent and that said Letters Patent is hereby corrected as shown below:

Column 1, line 58, after "of" insert $--\Delta V_{BL}--$.

Signed and Sealed this

Twelfth Day of September, 1995

BRUCE LEHMAN

Attest:

Attesting Officer      Commissioner of Patents and Trademarks